US006475353B1

United States Patent
Lantsman

(10) Patent No.: US 6,475,353 B1
(45) Date of Patent: Nov. 5, 2002

(54) APPARATUS AND METHOD FOR SPUTTER DEPOSITING DIELECTRIC FILMS ON A SUBSTRATE

(75) Inventor: Alexander D. Lantsman, Middletown, NY (US)

(73) Assignees: Sony Corporation, Tokyo (JP); Materials Research Corporation, Orangeburg, NY (US)

( * ) Notice: Subject to any disclaimer, the term of this patent is extended or adjusted under 35 U.S.C. 154(b) by 576 days.

(21) Appl. No.: 08/861,649

(22) Filed: May 22, 1997

(51) Int. Cl.[7] .............................................. C23C 14/34
(52) U.S. Cl. ............................ 204/192.12; 204/298.07; 204/298.11; 204/298.14
(58) Field of Search ...................... 204/192.12, 192.3, 204/298.06, 298.07, 289.08, 298.11, 298.14

(56) References Cited

U.S. PATENT DOCUMENTS

| 3,661,758 A | * | 5/1972 | Jackson et al. | ........ 204/298.14 |
| 4,426,275 A | * | 1/1984 | Meckel et al. | ......... 204/298.14 |
| 4,931,169 A | * | 6/1990 | Scherer et al. | ......... 204/298.11 |
| 4,948,458 A | | 8/1990 | Ogle | .......................... 156/345 |
| 4,990,229 A | | 2/1991 | Campbell et al. | ...... 204/298.16 |
| 5,178,739 A | | 1/1993 | Barnes et al. | .......... 204/192.12 |
| 5,346,578 A | | 9/1994 | Benzing et al. | ............. 156/345 |

FOREIGN PATENT DOCUMENTS

| JP | 63-211629 | * | 9/1988 | ............ 204/298.08 |
| JP | 1-111872 | * | 4/1989 | ............ 204/298.06 |

OTHER PUBLICATIONS

Stern, "Reducing Dust–Induced Pinholes in Sputtered Films", IBM Tech. Discl. Bulletin, vol. 12, No. 1, Jun. 1969, p. 149.*

* cited by examiner

Primary Examiner—Rodney G. McDonald
(74) Attorney, Agent, or Firm—Wood, Herron & Evans, LLP

(57) ABSTRACT

Apparatus and method for sputter depositing a layer of material comprises a sputtering chamber having an internal conductive wall which provides an electrical reference for plasma during sputter deposition. A conductive shield positioned in the processing space of the chamber between the target and the substrate is configured for capturing sputtered material which would deposit on the chamber wall surface during sputter deposition. The conductive shield reduces the amount of sputtered material depositing on the chamber wall and maintains a surface portion of the wall as a generally stable electrical reference for the plasma and is further operable for passing plasma therethrough during deposition to contact the stable electrical reference.

14 Claims, 1 Drawing Sheet

APPARATUS AND METHOD FOR SPUTTER DEPOSITING DIELECTRIC FILMS ON A SUBSTRATE

FIELD OF THE INVENTION

The present invention relates generally to sputtering techniques and to the sputter deposition of dielectric films on substrates, and specifically relates to an apparatus and method for maintaining a stable, continuous plasma during deposition of dielectric films.

BACKGROUND OF THE INVENTION

Sputter deposition is used extensively within the semiconductor industry to deposit thin metallic material and nonmetallic material films or layers onto a semiconductor substrate. Cathode sputter deposition, in particular, is widely utilized and involves the use of a negatively-biased target of the desired sputtering material which is to be deposited onto the surface of a substrate. The target is supported in the processing space of a vacuumed sputter deposition chamber in a position generally opposite and facing the surface of the substrate to be sputter coated with a layer of the target material.

A negative electric potential is applied to the target through a cathode support which is coupled to an appropriate plasma power source. The negatively-biased target produces an electric field proximate the target which causes electrons to be emitted from the target surface toward a remote anode, such as the internal metal wall surfaces of the sputter chamber. The metal sputter chamber is coupled to a source of ground potential or a "ground," and the internal wall surfaces thus act as a ground reference for the plasma discharge and as a return current path for the plasma power source. The emitted electrons ionize an inert process gas which is introduced within the chamber, and positive gas ions are formed creating a gas plasma discharge of high ion concentration. The positive ions of the plasma are attracted to the negatively-biased target and the ions thereby bombard the surface of the target, ejecting or sputtering atoms of the target material from the target. Atoms of sputtered material emitted from the target strike and adhere to the exposed surface of the substrate positioned opposite the target and thereby form a material film or layer on the substrate.

The sputtered target material travels in various directions from the target. While some of the sputter material contacts the substrate and deposits thereon, other material contacts other exposed surfaces in the processing space, such as the grounded surfaces of the chamber wall. The sputter material thus coats the chamber wall surfaces as well as the substrate surface.

Sputter deposition is used to deposit layers of various materials onto substrates and particularly to deposit dielectric material layers. However, when layers of dielectric material coat the metallic surface inside the chamber, the sputter deposition process is degraded. Herein, the term "dielectric" will be used to refer to materials conventionally referred to as dielectric, as well as semiconductor materials. More specifically, since the internal conductive surfaces of the chamber act as the ground reference for the plasma discharge and as a return path for the current flow of the plasma power source, any deposition of a dielectric material layer on the wall surfaces makes the plasma discharge unstable. That is, the high resistivity dielectric layer depositing or growing on the conductive wall surfaces of the chamber leaves the plasma discharge without a direct ground reference and changes the electrical impedance of the return current path of the plasma power source. An unstable plasma discharge results. Furthermore, the operation of the plasma power source and the process controls associated with the sputter deposition process also becomes unstable due to the lack of a sufficient ground reference and return current path in the chamber. The instability of the plasma discharge, in turn, causes an unacceptable deterioration in the deposited substrate layers and in the ultimate performance and properties of those substrate layers.

Unstable plasma discharges and the resulting degraded film properties have been observed when sputtering dielectric materials, such as lead zirconium titanate (PZT), barium strontium titanate (BST) and quartz, and also have been observed with the sputtering of semiconductor materials such as silicon. To address this problem in the past, the sputtering chamber and any associated internal elements and surfaces therein had to be periodically and regularly cleaned and replaced. The cleaning and replacement process is a time consuming and labor intensive procedure and results in higher production costs and reduced productivity and efficiency of the process.

Accordingly, it is an objective of the present invention to produce and maintain a stable plasma discharge during sputter deposition of dielectric layers on substrates.

It is another objective of the invention to reduce the deterioration of the sputter deposited dielectric layers associated with sputter deposition using prior art apparatuses and methods.

It is still another objective of the invention to provide for stable deposition of dielectric films while reducing time and labor costs associated with cleaning and maintaining the deposition chamber.

It is another objective of the invention to reduce production costs and increase the productivity and efficiency of the deposition process when sputter depositing dielectric films.

SUMMARY OF THE INVENTION

The above discussed objectives and drawbacks of the prior art are addressed by the present invention, which provides a stable plasma discharge for depositing dielectric layers on substrates.

The invention provides stable dielectric deposition and reduces the maintenance and replacement costs of the deposition chamber, thus reducing production costs and increasing the productivity and efficiency of the sputter deposition process.

The present invention comprises a sputtering chamber having a conductive internal wall surface which defines the processing space. A substrate mount is positioned in the processing space for supporting the substrate therein, and a sputter target mount is positioned for supporting a target of dielectric material opposite the substrate mount such that a layer of the target material may be sputter deposited onto the substrate. A plasma power source biases the target mount and target thereon, and excites a process gas introduced into the processing space into a plasma discharge to sputter material from the target. The wall surface of the chamber is grounded to provide a ground reference for the plasma.

In accordance with the principles of the invention, a conductive shield is positioned in the processing space between the target and the substrate, and is configured and positioned for capturing an amount of sputtered material which would deposit on the internal wall surface during the deposition process. The shield maintains a portion of the wall surface generally free from the extensive build up of dielectric material which occurs on the other unshielded surfaces. Therefore, the shielded wall portions are maintained in a generally conductive state to provide a stable ground reference for the plasma discharge and a stable return current path for the plasma source. The shield has a plurality of apertures formed therein which are configured to pass plasma therethrough during the deposition process to contact the stable ground reference and current return path provided by the shielded surface portions of the chamber wall. Thus, while a portion of the dielectric sputter material deposits on the chamber wall surface, the plasma still has a stable ground reference and return current path which is effectively accessed through the shield during the deposition.

More specifically, in the preferred embodiment of the invention, the chamber wall surface and conductive shield are coupled together and thus are both grounded. Therefore, the outer surface of the shield also acts as a stable ground reference. The shield is preferably cylindrically shaped with one end disposed proximate the target and another end disposed proximate the substrate. The shield surrounds a portion of the processing space between the target and substrate in which the plasma is located, and through which the sputtered target particles will travel. During sputter deposition, the inner shield surface, which faces inwardly into the processing space, and the side surfaces of the shield apertures intercept sputtered particles and become coated by the sputtered material. The outer surface of the shield, which faces toward the chamber wall surface, generally remains uncoated, as it collects very little or no deposition from the backwardly scattered particles of material which penetrate through the shield apertures to deposit on the wall surface. The shield effectively masks a portion of the wall surface to maintain that surface portion in a generally uncoated and conductive state to provide the stable ground reference for the plasma discharge. The uncoated wall portions and uncoated shield outer surface cumulatively provide the ground reference because the plasma contacts them through the apertures.

The plurality of apertures are arranged around the shield and are preferably geometric in shape, such as circular or rectangular. Minimal dimensions of the apertures, such as their diameter or width dimensions, are preferably between 0.25 and 2.0 times the length of the mean free path for the process gas, e.g., Argon. That is, the sputter deposition process gas, at a chosen process pressure, will have particles with a mean free path length between collisions, and the shield apertures are dimensioned based upon that length. It has been found that apertures with minimum dimensions in the range of 0.25 to 2.0 times the mean free path length of the process gas will pass enough of the plasma discharge to the chamber walls and outer shield surface to ensure a stable plasma an sputter deposition.

To further ensure a stable plasma, a suitable number of apertures must be utilized to ensure that a sufficient amount of plasma passes through the shield without having too much plasma between the shield outer surface and the chamber wall surface. To that end, the ratio of cumulative open aperture area to the overall surface area of the inner surface of the shield, or the "transparency" of the shield, is preferably chosen to be in the range of approximately 0.1 to 0.5. That is, approximately 10% to 50% of the shield is open for the plasma to pass therethrough. The disclosed transparency and aperture dimensions for the shield produce suitable deposition results without the plasma detrimentally etching the outer surface of the shield to any great extent.

The shield extends into the processing space between the target and substrate and has a cross section which is preferably similar to the shape of the target or substrate, that is, circular, to give the shield its overall cylindrical shape. While shielding the chamber walls, the shield is configured and positioned within the processing space to provide a generally unobstructed path between the target and the substrate so that the deposition rate for the substrate is not dramatically affected. The conductive shield is preferably treated to increase adhesion of the deposited material. For example, the shield may be grit-blasted or plasma-sprayed for increasing deposition adhesion thereto.

The invention produces a stable and continuous sputter deposition process for sputter deposition of dielectric material layers, and reduces the deterioration of the sputter deposited layers. The invention further reduces the maintenance and replacement of the deposition chamber and elements, and thus reduces production costs and increases the overall productivity and efficiency of the sputter deposition process. These benefits and advantages of the invention over the prior art apparatuses and methods will become more readily apparent from the Brief Description of the Drawings and Detailed Description of the Invention below.

BRIEF DESCRIPTION OF THE FIGURES

The accompanying drawings, which are incorporated in and constitute a part of this specification, illustrate embodiments of the invention, and together with a general description of the invention given above, and the detailed description of the embodiments given below, serve to explain the principles of the invention.

DETAILED DESCRIPTION OF SPECIFIC EMBODIMENTS

Figure 1:
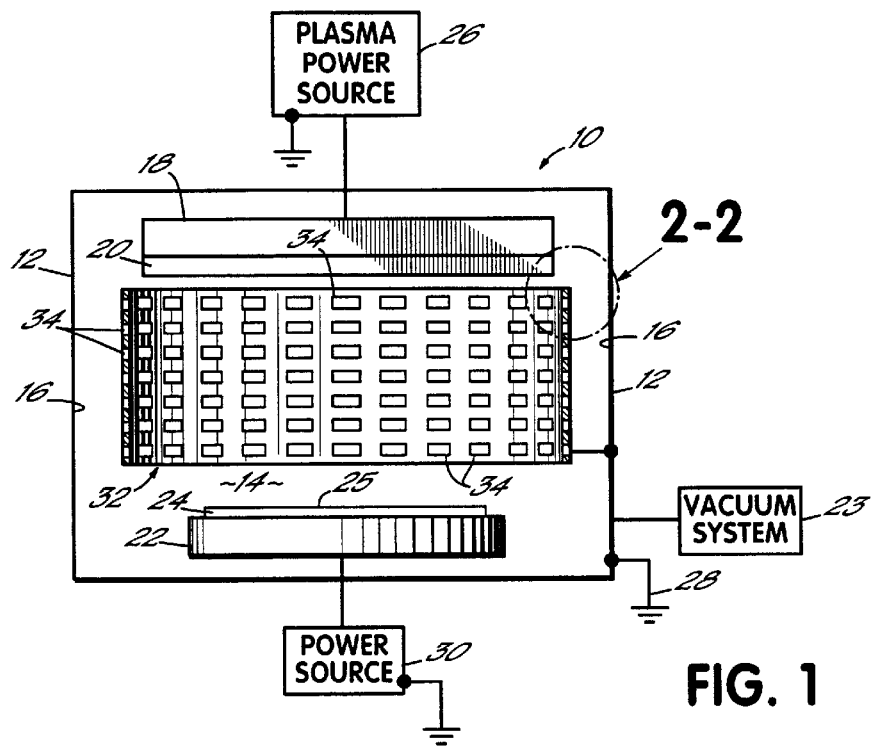
FIG. 1 is a front schematic view, in partial crosssection, of the sputter deposition apparatus of the invention.

The invention is illustrated in FIG. 1 and comprises a sputtering chamber 10 having an internal wall or walls 12 which define a processing space 14. The sputtering chamber is preferably made of metal, such as stainless steel, and the chamber walls 12 thus have conductive internal surfaces 16 which are proximate the processing space 14. A sputter target mount 18 with a target of dielectric material 20 coupled thereto is positioned in the processing space 14. Other material targets, such as metal targets, might be utilized with the invention; however, the invention is particularly suitable for depositing dielectric material layers. A substrate mount 22 for supporting a substrate 24 is also positioned in the processing space, opposite the target 20.

A plasma power source 26 is coupled to target mount 18 and target 20 to bias the target for sputter deposition. Plasma power source 26 will generally include an RF generator and a matching network (not shown), or alternatively, might include a pulse DC power supply (not shown). If reactive sputtering is desired, the plasma power source may also include a DC power supply. The plasma power source negatively biases target 20 for cathodic sputtering. A process gas (not shown) is introduced into processing space 14, generally between target 20 and substrate 24. Sputtering chamber 10 is connected to a source of ground potential or a ground reference 28 to ground the walls 12 and the internal conductive surfaces 16 thereof. The grounded wall surfaces 16 provide a ground reference for the plasma and a return current path for source 26 as discussed further hereinbelow.

An electric field is created between the negatively-biased target 20 and the grounded wall surfaces 16, and the electric field excites the process gas between the target 20 and substrate 24 to form a gas plasma or plasma discharge. The positively-biased ions of the plasma discharge are attracted to the negatively-biased target 20 and thus bombard the target to sputter particles of target material away from the target. The particles of target material then deposit upon the exposed upper surface 25 of substrate 24 according to sputter deposition principles. The sputter deposition chamber 12 will generally be vacuumed and thus is coupled to a vacuum system 23. Also, additional peripheral process elements, such as substrate handling mechanisms, process controls, gas supplies, collimators, and other target and substrate shields (collectively not shown) might also be utilized with the present invention. Furthermore, a power source 30 might also be coupled to substrate mount 22 for biasing the substrate 24 during the sputter deposition.

In accordance with the principles of the present invention, a conductive shield 32 is positioned in the processing space 14 between the target 20 and substrate 24. A preferred embodiment of the shield is formed of a vacuum grade stainless steel (e.g. 309 stainless) and cylindrically shaped having a circular cross section which is preferably similar to the shape of the target 20 and/or substrate. Shield 32 is positioned as shown in FIG. 1 to generally surround the portion of processing space 14 between target 20 and substrate 24. The shield is hollow in the center and generally does not obstruct the progress of the sputtered material particles from the target to the substrate. However, the conductive shield 32 is configured for capturing an amount of sputtered material which would otherwise deposit on chamber wall surfaces 16 during the sputter deposition process. The conductive shield 32 is operable for reducing the amount of sputtered material which will deposit on a portion of the chamber wall surfaces 16, and thereby maintains that shielded surface portion as a generally stable electrical reference for the plasma and stable return current path for plasma power source 26. As described further hereinbelow, the conductive shield 32 is further operable for passing the plasma therethrough during the sputter deposition process to contact the stable electrical reference provided by the shielded portions of surfaces 16. Thereby, a stable plasma discharge is maintained and a stable and continuous deposition process is achieved.

Figure 2:
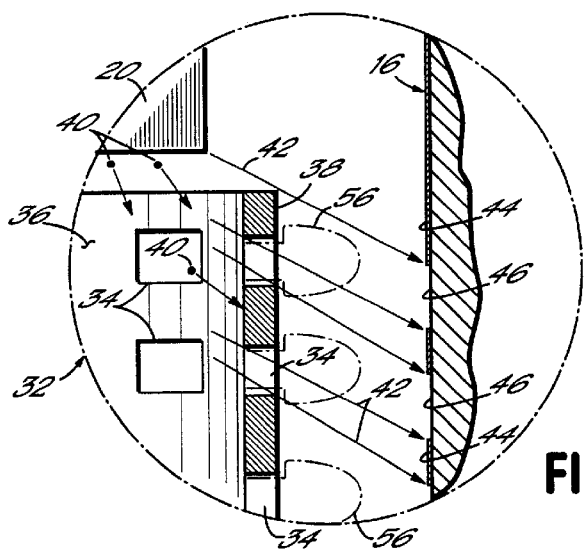
FIG. 2 is an enlarged view of the incircle portion of FIG. 1, indicated by reference numeral 2—2.

Referring to FIG. 2, conductive shield 32 has a plurality of plasma-passing apertures 34 formed therein. An inner surface 36 of shield 32 is exposed to the processing space between target 20 and substrate 24 while an outer surface 38 of the shield generally faces the internal wall surface 16 of sputtering chamber 10. In that way, surface 36 of the shield captures a portion of the sputtered material which would otherwise deposit on the chamber wall surfaces 16, as indicated by sputter particles 40. The inner surface 36 of shield 32 captures the sputter particles 40 and prevents their deposition onto the wall surfaces 16. However, some of the sputter particles, as indicated by reference numeral 42, will pass through the openings 34 and thus deposit upon wall surfaces 16 to form a deposition layer 44 as shown in FIG. 2. Shield 32 thus masks the wall surface 16. Where the shield intercepts a portion of the sputtered particles, generally clean or uncoated areas 46 are formed on the wall surfaces 16. As discussed herein, the generally clean or uncoated areas 46 provide a stable ground reference for the plasma discharge and return current path for source 26.

Referring to FIG. 2, the inner surface 36 of the shield and the side surfaces 50 of the apertures 34 become coated with a layer 52 of the scattered sputtered material. However, the outer surface 38 of shield 32 also stays generally clean or uncoated during the sputtering process. That is, surface 38 collects very little or no deposition from the sputtered material which scatters backwards from wall surface 16 after it penetrates through the apertures 34 of the shield 32. Shield 32, and particularly the inner surface 36, is preferably treated so as to increase adhesion of the sputtered material thereto. For example, the exposed surfaces of the shield may be grit blasted or plasma sprayed for increasing such adhesion.

In accordance with another aspect of the present invention, the shield is coupled to a source of electrical potential, and preferably to a source of ground potential. In the preferred embodiment, the shield 32 is coupled with the grounded chamber walls 12. Shield 32 is thus grounded, and the generally clean outer surface 38 of the shield also acts as a stable ground reference for the plasma and return current path for source 26. Referring to FIG. 2, plasma indicated by dash lines 56 extends through the apertures 34 formed in the shield 32. Preferably, the shield 32 is configured and dimensioned so as to pass a portion of the plasma therethrough without creating too much plasma between the outer surface 38 of the shield 32 and the surfaces 16 of the chamber walls 12. If too much plasma is created between the surfaces 38 and 16, the plasma 56 may etch the outer surface of the shield and thus degrade or contaminate the deposition process.

To that end, the apertures 34 have a minimum diameter dimension or other dimension, such as a width dimension, which is in the range of approximately 0.25 to 2.0 times the mean free path length of the process gas at the given process pressure. For example, the process gas which is utilized in the sputter deposition process, for example, Argon, has particles which have an associated mean free path length between collisions at a given pressure. For a selected process gas and process pressure, the dimensions of the shield apertures 34 are chosen so as to be within the range to allow plasma 56 to pass through the apertures 34 without having a large amount of plasma outside of the shield 32 and in between the surfaces 38 and 16. It has been found that apertures having minimal dimensions in the range of approximately 0.25 to 2.0 times the mean free path length of the process gas are suitable for the invention.

Figure 3:
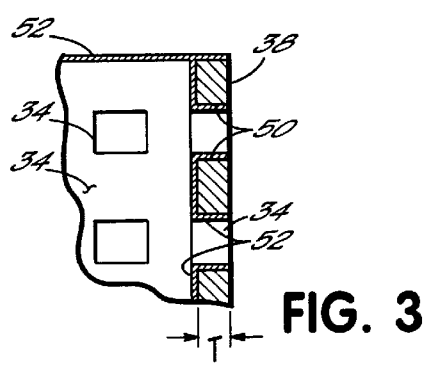
FIG. 3 is an enlarged cross-sectional portion of the shield of the invention shown in FIG. 1.

In a preferred embodiment of the invention, the apertures 34 are geometric shapes, such as rectangles as illustrated in the Figures, or circles. Therefore, a diameter dimension of a circular aperture or a width or height dimension of a rectangular aperture will preferably be in the range of approximately 0.25 to 2.0 times the mean free path length of the process gas particles. For example, in using Argon at a process pressure of 3–15 mT, the dimension of the apertures might be in the range of approximately ¼" (6.4 mm) to ½" (12.7 mm). For one embodiment of shield 32, a suitable thickness of the shield wall, as indicated by dimension "T" in FIG. 3, is ¹⁄₁₆" (1.58 mm), while the diameter of the shield is 14" (355.6 mm), and the length is 2.5" (63.5 mm). It will be appreciated that the configuration and dimensions of the shield will vary depending upon the internal configurations of the sputtering chamber and the dimensions of the target and substrate. Furthermore, the dimensions of the apertures may be optimized for a particular process gas. Also, the distance between the outer shield surface 28 and wall surface 15 may be optimized and will generally be in the range of ¼" (6.4 mm) to 1" (25.4 mm).

For proper passage of the plasma through the shield to contact the stable ground references, the shield should have an electrical "transparency" preferably between 0.1 and 0.5. The electrical transparency is defined as the ratio of the cumulative amount of aperture area produced by apertures 34 with respect to the total surface area of the inner surface 36 of shield 32. For the cylindrical shield of FIG. 1, the length of the shield as well as the inner circumference dimension will define the total surface area of inner surface 36. The amount of open area or cumulative area of the apertures 34 would then preferably be between 10% and 50% of the predetermined inner surface area. The process gas and plasma distribution in the chamber affects the uniformity of the thickness of the sputter deposited material layer as well as other properties of the growing layer. Accordingly, the size and placement of the apertures 34 may be optimized to achieve a desired uniform pattern of process gas pressure above the substrate 24 to achieve an optimized plasma discharge. The apertures shown in the Figures are uniformly sized; however, the sizes of the apertures may be varied around the shield in different areas thereof to improve the uniformity of the deposition by varying the displacement and uniformity of the plasma.

Utilizing the present invention, the plasma discharge 56 is stable and uniform because the plasma ground reference and return current path for the plasma source are stable. The grounded wall portions 46 and shield outer surface 38 cooperate to provide the stable ground reference. The sputter deposition apparatus of the invention is therefore reliable and requires very little maintenance. Deterioration of the sputtered dielectric layers is reduced, and the overall production costs of the process are reduced as well. This results in increased productivity and efficiency of the apparatus and process for sputtering dielectric layers on substrates.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. An apparatus for sputter depositing a layer of material on a substrate comprising:
   a sputtering chamber having an internal conductive wall which defines a processing space;
   a substrate mount positioned in the processing space for supporting a substrate therein;
   a sputter target mount positioned in the processing space for supporting a target therein opposite said substrate mount;
   a power source for biasing a target and exciting a process gas introduced in the processing space into a plasma such that the plasma will sputter material from a target supported on said target mount and the sputtered material will deposit on a substrate supported on said substrate mount and on a surface of the chamber wall to form respective material layers thereon, a surface of the internal chamber wall operable for providing an electrical reference for the plasma during sputter deposition;
   a conductive shield positioned in the processing space between the target mount and the substrate mount and configured for capturing a portion of the sputtered material which would otherwise deposit on the chamber wall surface during sputter deposition;
   a source of ground potential, the conductive shield being coupled to the source of ground potential for grounding the shield during sputter deposition;
   the conductive shield operable for reducing the amount of sputtered material which will deposit on a portion of the chamber wall surface and maintaining said chamber wall surface portion as a generally stable electrical reference for the plasma, and further including a plurality of apertures formed therein, the apertures comprising a cumulative area in the range of approximately 10% to 50% of the area of an inner surface of the shield for being operable for passing plasma therethrough during sputter deposition to contact said stable electrical reference;
   at least one of the shield apertures having at least one dimension in the range of approximately 0.25 to 2.0 times the mean free path length of a process gas to be introduced into the chamber;
   whereby a stable and continuous sputter deposition process may be achieved.

2. The apparatus of claim 1 wherein the shield has a surface and is operable to reduce sputter deposition on said shield surface for providing another generally stable electrical reference for the plasma passing through the shield during sputter deposition.

3. The apparatus of claim 1 wherein the chamber wall is coupleable to an electrical ground potential, the apparatus further comprising a source of ground potential for coupling to the wall to ground said wall during a sputter deposition process.

4. The apparatus of claim 1 wherein the chamber and conductive internal wall are electrically coupled together for being maintained at a generally equal electrical potential during a sputter deposition process.

5. The apparatus of claim 1 wherein the apertures are in the shape of geometric figures.

6. The apparatus of claim 5 wherein the apertures are in the shape of circles.

7. The apparatus of claim 5 wherein the apertures are in the shape of rectangles.

8. An apparatus for sputter depositing a layer of material on a substrate comprising:
   a sputtering chamber having an internal conductive wall which defines a processing space;
   a substrate mount positioned in the processing space for supporting a substrate therein;
   a sputter target positioned in the processing space opposite said substrate mount;
   a power source for biasing the target and exciting a process gas introduced in the processing space into a plasma such that the plasma sputters material from the target and the sputter material deposits on a substrate supported on said substrate mount and on a surface of the chamber wall to form respective material layers thereon, a surface of the chamber wall operable for providing an electrical reference for the plasma during sputter deposition;
   a conductive shield positioned in the processing space between the target mount and the substrate mount and configured for capturing a portion of the sputtered material which would otherwise deposit on the chamber wall surface during sputter deposition, the shield having a surface operable for providing another electrical reference for the plasma;

a source of ground potential coupled to the conductive shield and chamber wall for maintaining said shield and wall as a ground reference;

the conductive shield operable for reducing the amount of sputtered material which deposits on a portion of the chamber wall surface and maintaining said chamber wall surface portion as a generally stable ground reference for the plasma, and further including a plurality of apertures formed therein, the apertures comprising a cumulative area in the range of approximately 10% to 50% of the area of an inner surface of the shield for being operable for passing plasma therethrough during sputter deposition to contact said shield and wall ground references;

at least one of the shield apertures having at least one dimension in the range of approximately 0.25 to 2.0 times the mean free path length of a process gas to be introduced into the chamber;

whereby a stable and continuous sputter deposition process may be achieved.

9. The apparatus of claim 8 wherein the shield is operable to reduce sputter deposition on said shield electrical reference surface for providing another generally stable ground reference for the plasma passing through the shield during sputter deposition.

10. The apparatus of claim 8 wherein the apertures are in the shape of geometric figures.

11. A method for sputter depositing a layer of material on a substrate comprising:

providing a sputtering chamber having an internal conductive wall which defines a processing space;

positioning a substrate in the processing space;

positioning a sputter target in the processing space opposite said substrate;

biasing the target and exciting a process gas introduced in the processing space into a plasma such that the plasma sputters material from the target and the sputter material deposits on the substrate and on the chamber wall to form respective material layers thereon, a surface of the chamber wall providing an electrical reference for the plasma during sputter deposition;

positioning a conductive shield between the target and substrate for capturing an amount of the sputtered material to reduce the amount of sputtered material which otherwise deposits on a portion of the chamber wall surface and maintaining said chamber wall surface portion as a generally stable electrical reference for the plasma;

the shield including a plurality of apertures comprising a cumulative area in the range of approximately 10% to 50% of the area of an inner surface of the shield;

the process gas having particles with a predetermined mean free path length and at least one of the shield apertures having at least one dimension in the range of approximately 0.25 to 2.0 times the mean free path length of a process gas introduced into the chamber;

passing plasma through the apertures and to the stable electrical reference for maintaining a stable plasma;

coupling the conductive shield to a source of ground potential for grounding the shield during sputter deposition;

whereby a stable and continuous sputter deposition process may be achieved.

12. The method of claim 11 further comprising capturing an amount of the sputtered material with an inner surface of the conductive shield positioned between the target and substrate.

13. The method of claim 11 further comprising coupling a source of ground potential to the chamber to ground said chamber wall surface during a sputter deposition process for providing a stable ground reference for the plasma.

14. The method of claim 11 further comprising coupling together the conductive shield and conductive chamber wall and maintaining the surfaces of the wall and shield at an electrical potential during a sputter deposition process to provide said electrical reference.

* * * * *

UNITED STATES PATENT AND TRADEMARK OFFICE
CERTIFICATE OF CORRECTION

PATENT NO. : 6,475,353 B1
DATED : November 5, 2002
INVENTOR(S) : Alexander D. Lantsman It is certified that error appears in the above-identified patent and that said Letters Patent is hereby corrected as shown below:

<u>Title page,</u>
Item [73], change "Assignees: Sony Corporation, Tokyo (JP); Materials Research Corporation, Orangeburg, NY (US)" to -- Assignee: Tokyo Electron Limited, Tokyo (JP) --

Signed and Sealed this

Second Day of December, 2003

JAMES E. ROGAN
*Director of the United States Patent and Trademark Office*